United States Patent [19]

Jain et al.

[11] Patent Number: 5,475,569
[45] Date of Patent: Dec. 12, 1995

[54] METHOD OF TESTING FINE PITCH SURFACE MOUNT IC PACKAGES

[75] Inventors: Praveen Jain, Gilbert; Steve Prough, Phoenix, both of Ariz.

[73] Assignee: Intel Corporation, Santa Clara, Calif.

[21] Appl. No.: 419,856

[22] Filed: Apr. 11, 1995

Related U.S. Application Data

[63] Continuation of Ser. No. 153,440, Nov. 16, 1993, abandoned.

[51] Int. Cl.$^6$ .................................................. H05K 5/02
[52] U.S. Cl. ..................... 361/813; 361/772; 361/778; 361/802; 361/807; 174/52.4; 174/261; 257/666
[58] Field of Search ................................ 361/747, 748, 361/759, 772, 778, 802, 807, 813; 174/52.4, 261, 262; 257/666, 672, 692, 695, 697

[56] References Cited

U.S. PATENT DOCUMENTS 5,031,022  7/1991  Yamamoto et al. ..................... 357/70

Primary Examiner—Leo P. Picard
Assistant Examiner—Y. Whang
Attorney, Agent, or Firm—Blakely, Sokoloff, Taylor & Zafman

[57] ABSTRACT

An electronic package that is tested before the leads of the package are cut and bent into a final shape. The electronic package has a plurality of leads that extend from an outer housing of the package. The package is typically rectangular in shape and has a group of leads extending from each side of the housing. Extending along each group of leads is a strip of dielectric material that is spaced an offset distance from the side of the housing. The package is tested by placing a plurality of corresponding test pins into contact with the leads over their final cut and formed length in an area between the housing and the dielectric strip. The area of contact corresponds to the ends of the final assembled leads, so that the actual impedance of the leads over their final cut and formed length are tested. The dielectric strip provides structural support for the leads during the handling and testing of the package. The leads of the package are part of a lead frame which has four outer die paddle support bars that are also exterior to the package housing. The die paddle support bars have alignment holes, that together with alignment pins of the tester, align the leads with the test pins.

14 Claims, 3 Drawing Sheets

METHOD OF TESTING FINE PITCH SURFACE MOUNT IC PACKAGES

This is a continuation of application Ser. No. 08/153,440 filed Nov. 16, 1993 now abandoned.

BACKGROUND OF THE INVENTION

1. Field of the Invention

The present invention relates to an electronic package for an integrated circuit.

2. Description of Related Art

Integrated circuits (ICs) are typically housed within a package that can be mounted to a printed circuit board. A conventional IC package includes an outer housing that encapsulates the integrated circuit and a lead frame that couples the IC to the printed circuit board. The lead frame has a plurality of leads that extend from the outside of the housing. The leads are commonly bent into a S shape configuration and soldered to surface pads on the printed circuit board.

Electronic packages are typically tested before being assembled to the printed circuit board. A conventional method of testing electronic packages is to place the package within a tester until the leads are in contact with a plurality of test pins. Signals are then transmitted between the IC and the tester to check the integrity of the package. To align the leads with the test pins, the corner leads of the package are placed within an alignment feature of the tester. The leads of the package are relatively small and weak and are thus susceptible to damage when placed within the tester. It is therefore desirable to test the package in a manner that will not damage the leads.

Another method of testing an electronic package is to place the test pins in contact with the leads before the leads are bent into the S-shaped configuration. In this method the lead frame has a rigid outer plastic frame that is molded along with the housing of the package. The outer frame provides structural stability for the leads during the handling and testing of the package. The ends of the leads are bent against the sides of the outer plastic frame. Test pins are then pushed into contact with the ends of the leads. After the package is tested, the outer plastic frame is removed and the leads are bent into the final shape. One disadvantage of this method of testing arises because the length of the leads that are tested are longer than the lead length that is actually soldered to the printed circuit board. The tester must then compensate for the additional impedance and noise associated with the extra lead length. Additionally, having to mold the outer plastic frame produces a larger number of mold defects and a lower production yield of the package. It would be desirable to have a package which can be accurately tested before the leads are bent, without either electrical compensation or increased risk of yield loss to reduce the probability of the leads becoming damaged.

SUMMARY OF THE INVENTION

The present invention is an electronic package that is tested before the leads of the package are cut and bent into a final shape. The electronic package has a plurality of leads that extend from an outer housing of the package. The package is typically rectangular in shape and has a group of leads extending from each side of the housing. Extending along each group of leads is a strip of dielectric material that is spaced an offset distance from the side of the housing. The package is tested by placing a plurality of corresponding test pins into contact with the leads in an area between the housing and the dielectric strip. The area of contact corresponds to the ends of the final assembled leads, so that the actual impedance of the leads cut to their final length are tested. The dielectric strip provides structural support for the leads during the handling and testing of the package. The leads of the package are part of a lead frame which has four outer die paddle support bars that are also exterior to the package housing. The die paddle support bars have alignment holes, that together with alignment pins of the tester, align the leads with the test pins. After the package is tested, the leads are cut, the dielectric strips and outer die paddle support bars are removed, and the leads are bent into the final shape.

It is therefore an object of the present invention to provide an electronic package that can be accurately tested, without electrical compensation or exposure to increased production yield loss, before the leads of the package are assembled into a final condition.

It is also an object of the present invention to provide a method for testing an electronic package before the leads are cut from the lead frame.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
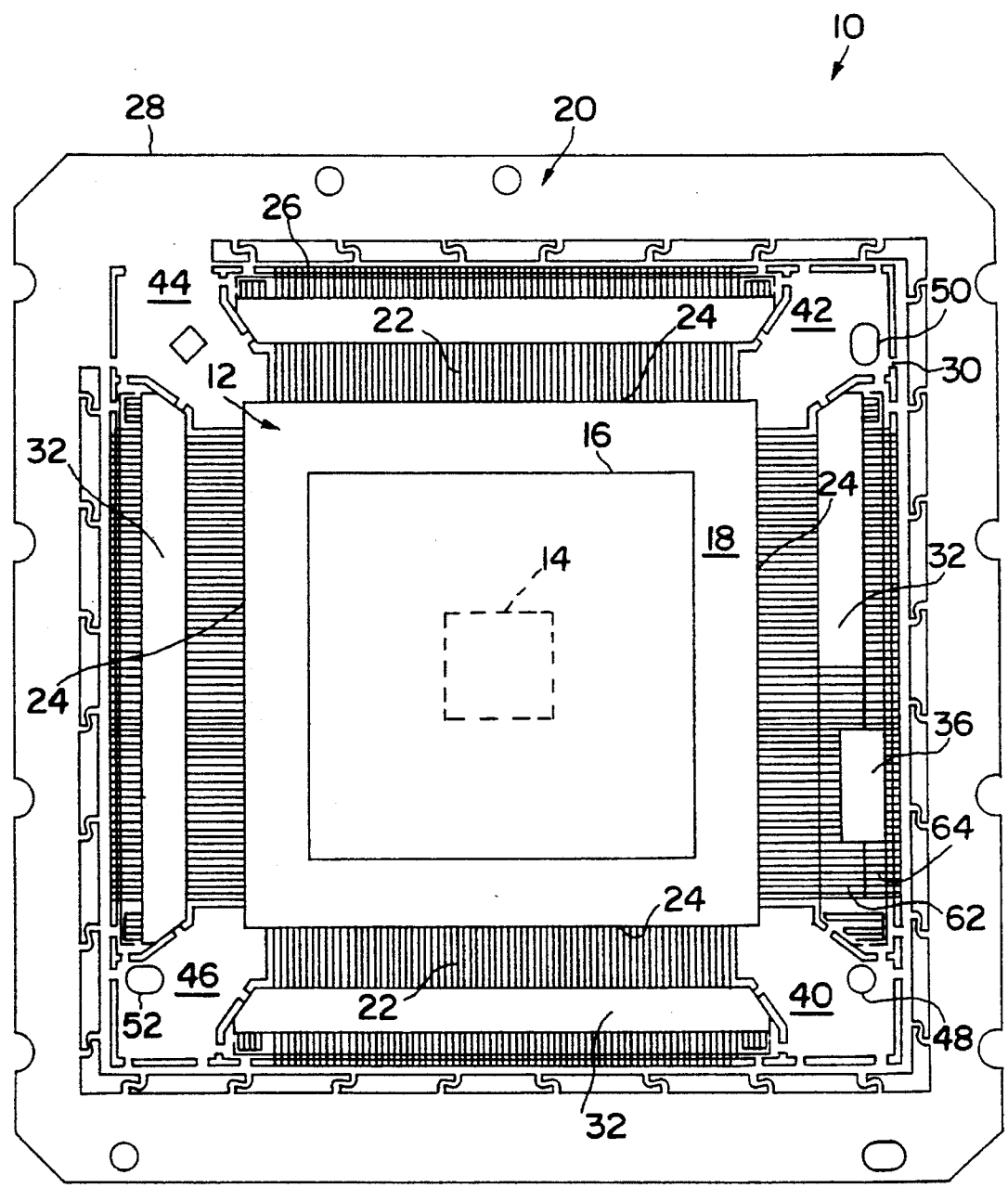
FIG. 1 is a top view of an electronic package of the present invention.

Referring to the drawings more particularly by reference numbers, FIG. 1 shows an electronic package 10 of the present invention. The package 10 includes a housing 12 that contains a die 14. The die 14 is typically an integrated circuit such as a microprocessor. The housing 12 is typically constructed from a molded plastic dielectric material. The package 10 may also contain a heat sink 16 which extends to the top surface 18 of the housing 12. The heat sink 16 is typically constructed from a nickel plated copper material.

The package 10 has a lead frame 20 which contains a plurality of leads 22. The leads 22 are coupled to the die 14, typically with either wire bonds or TAB (tape automated bonding) leads (not shown) within the housing 12. The TAB/wire electrically couple the leads 22 to the integrated circuit 14. The leads 22 are assembled into four different groups which each extend from four outer side surfaces 24 of the housing 12. The leads 22 extend into an outer rim 26 which is connected to an outer frame 28 by a plurality of tabs 30.

Figure 2:
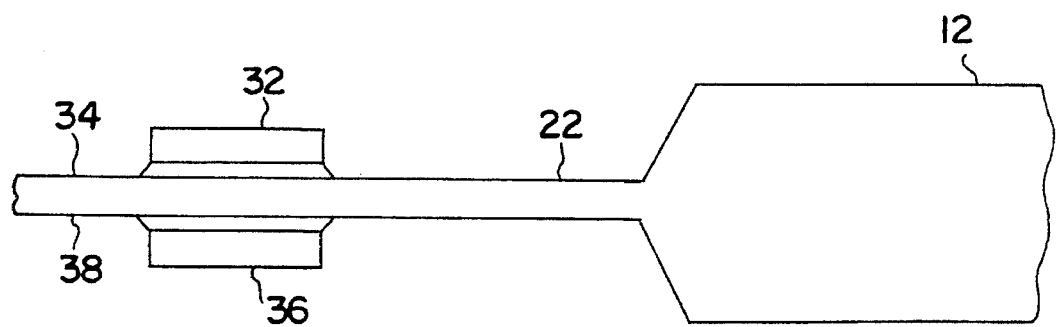
FIG. 2 is a side view of the lead of a lead frame which has a pair of dielectric strips on each side of the leads.

Extending across each group of leads 22 is a strip of dielectric material 32. The strips 32 are offset from the sides 24 of the housing by a distance that correlates to the final length of the leads 22 in a fully assembled form. As shown in FIG. 2, each group of leads 22 may have a first dielectric strip 32 on a first surface 34 of the leads and a second dielectric strip 36 on an opposite second surface 38 of the leads. In the preferred embodiment, the dielectric strips 32 and 36 are constructed from a polymeric tape that is attached to the leads with a dielectric adhesive. The polymeric tape 32 provides structural integrity for the leads 22 when the lead frame 20 is being tested.

The lead frame 20 also has a first outer die paddle support bar 40, a second outer die paddle support bar 42, a third outer die paddle support bar 44 and a fourth outer die paddle support bar 46. The first outer die paddle support bar 40 contains a circular shaped zero datum hole 48. The second outer die paddle support bar 42 contains an oblong x alignment slot 50 and the fourth outer die paddle support bar 46 contains an oblong y alignment slot 52. Although the datum hole 48 and alignment slots 50 and 52 are shown in support bars 40, 42 and 46, it is to be understood that the alignment features 48–52 can be placed in any combination of three support bars.

Figure 3:
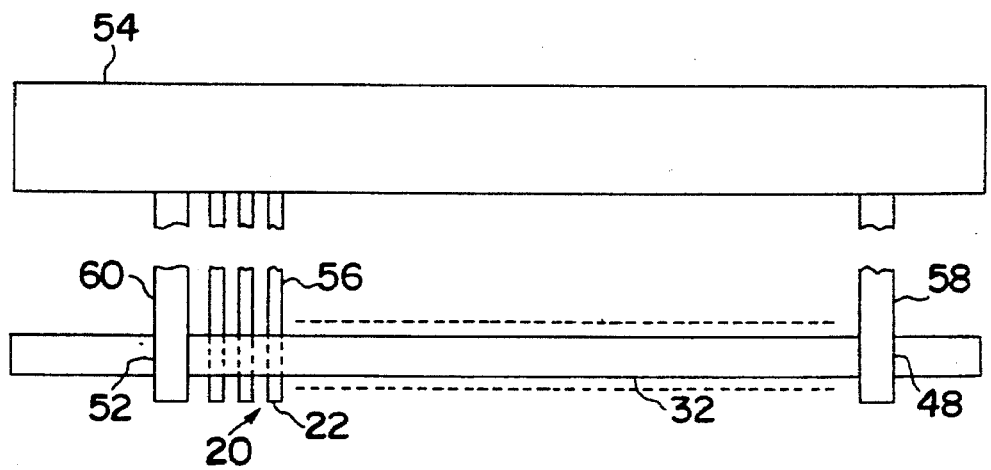
FIG. 3 is a perspective view of the package being tested with a tester.

To test the package 10, the tabs 30 are cut and the outer frame 28 is removed from the lead frame 20. As shown in FIG. 3, the lead frame 20 is then placed into a tester 54, so that a plurality of test pins 56 are in contact with corresponding leads 22 of the lead frame 20. The tester 54 has a zero datum pin 58 that is inserted into the zero datum hole 48 of the lead frame 20 to align the leads 22 with the test pins 56. The tester 54 also has an x alignment pin (not shown) and a y alignment pin 60 which extend into the alignment slots 50 and 52, respectively. The alignment pins and slots insure that the test pins 56 are not skewed relative to the leads 22. The additional stiffness of the dielectric strips 32 prevent the leads 22 from becoming damaged when the test pins 56 are placed into contact with the leads frame 20.

The test pins 56 are placed into contact with the lead frame 20 at a location that corresponds to the actual outer ends of the finally cut and formed leads 22. This pin 56 placement insures that the tester 54 is testing the package 10 with the exact impedance of the leads 22. Using the actual lead impedance produces a more accurate test result of the package 10.

After the package 10 is tested, the outer die paddle support bars 40–46 and the leads 22 are cut, and the dielectric strips and outer die paddle support bars are removed from the housing 12 and the leads 22. The leads 22 are then typically bent into a S shape configuration for final assembly.

Figure 4:
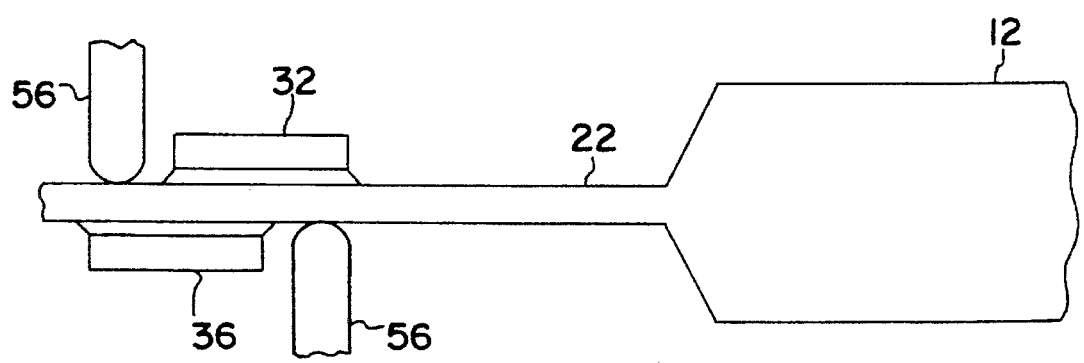
FIG. 4 is a side view similar to FIG. 2, showing an alternate embodiment where the dielectric strips are offset from each other.

FIG. 4 shows a preferred embodiment, wherein the first 32 and second 36 dielectric strips are offset from each other on the leads 22. The offset strips provide additional structural support for the leads, which may be particularly beneficial in resisting damage if the leads are tested more than once. As shown in FIG. 4, the test pin 56 can be placed into contact with the lead 22 adjacent to the first dielectric strip 32. The offset second dielectric strip 36 provides structural support behind the lead 22, to prevent the leads 22 from dimpling in response to the force of the test pin 56. If the package 10 is to be tested again, the test pin 56 can be placed adjacent to the second dielectric strip 36, wherein the lead 22 is supported by the backing of the first dielectric strip 32.

Figure 5:
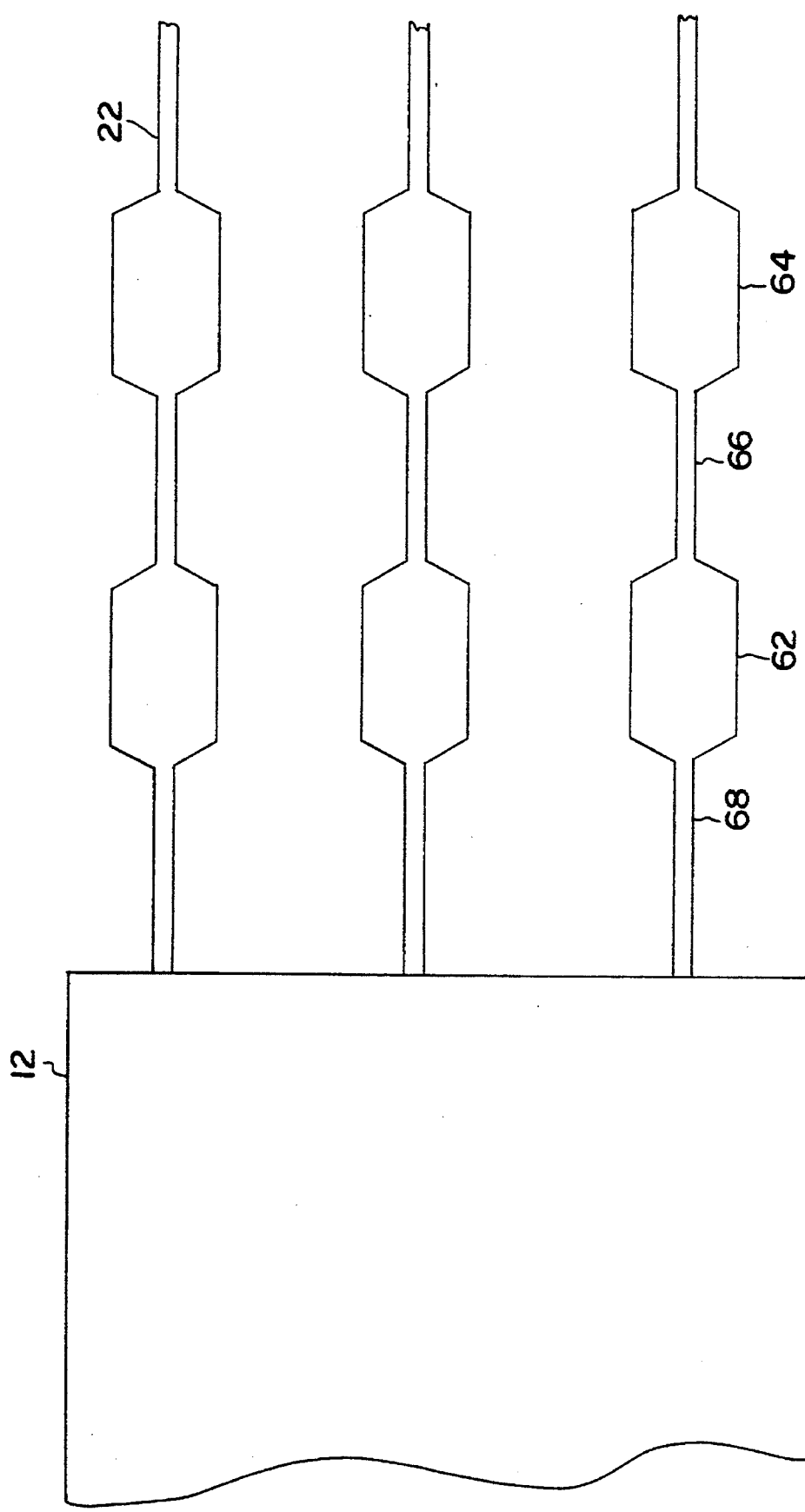
FIG. 5 is a enlarged top view of the leads of the lead frame showing contact areas of the leads.

FIG. 5 shows a preferred embodiment of the lead frame, wherein each lead 22 has a first test contact area 62 separated from a second test contact area 64 by a neck 66. The first contact area 62 is located at the end of a beam portion 68 which extends from the housing 12. As shown in FIG. 1, the first test contact area 62 is covered with the first dielectric strip 32 and the second contact area 64 is covered with the second dielectric strip 36. The test pins 56 are placed in contact with the contact areas 62 or 64 when the package is tested. The contact areas 62 and 64 are wider wider than the beam 68 and neck 66 portions to provide a larger landing area for the test pins 56.

What is thus provided is a package and a method of testing the package which can be performed before the leads of the package are cut and bent into the final assembly. The testing method is both accurate and provides a low risk production yield loss.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a housing with an outer surface;

an integrated circuit within said housing;

a lead frame coupled to said integrated circuit, said lead frame having a plurality of leads that extend from said outer surface of said housing, said leads having a first surface and a second opposite surface;

at least one strip of first dielectric material attached to said first surface of said leads a distance from said outer surface of said housing located approximately at a final length of said leads; and, at least one strip of second dielectric material attached to said second surface of said leads a distance from said outer surface of said housing located approximately at a final length of said leads, said second dielectric material being offset from said first dielectric material along a longitudinal axis of said leads.

2. The electronic package as recited in claim 1, wherein said lead frame has four groups of leads each extending from an outer side surface of said housing and there is a corresponding strip of dielectric material attached to each group of leads.

3. The electronic package as recited in claim 1, wherein said dielectric strips are constructed from a polymeric tape that is bonded to said leads with an adhesive.

4. The electronic package as recited in claim 1, wherein said leads each have a first test contact area separated from said housing by a beam portion of said lead, wherein said first test contact area is wider than said beam portion.

5. The electronic package as recited in claim 4, wherein said leads each have a second test contact area separated from said first contact area by a neck portion.

6. The electronic package as recited in claim 1, wherein said lead frame has a first, a second, a third and a fourth outer die paddle support bar, and said first outer die paddle support bar has a zero datum hole, said second outer die paddle support bar has a x datum slot and said fourth outer die paddle support bar has a y datum slot.

7. An electronic package, comprising:

a housing with four outer surfaces;

an integrated circuit within said housing;

a lead frame coupled to said integrated circuit, said lead frame having four groups of leads each extending from a corresponding outer surface of said housing and having a first surface and an opposite second surface, said lead frame also having a first, a second, a third and a fourth outer die paddle support bar, said first outer die paddle support bar having a zero datum hole, said second outer die paddle support bar having a x datum slot and said fourth outer die paddle support bar having a y datum slot; and, four strips of first dielectric material each attached to said first surfaces of a corresponding group of leads a distance from said outer surface of said housing located approximately at a final length of said leads; and, four strips of second dielectric material each attached to said second surfaces of a corresponding group of leads a distance from said outer surface of said housing located approximately at a final length of said leads, said second dielectric material being offset from said first dielectric material along a longitudinal axis of said leads.

8. The electronic package as recited in claim 7, wherein said dielectric strips are constructed from a polymeric tape that is bonded to said leads with an adhesive.

9. The electronic package as recited in claim 7, wherein said leads each have a first test contact area separated from said housing by a beam portion of said lead, wherein said first test contact area is wider than said beam portion.

10. The electronic package as recited in claim 9, wherein said leads each have a second test contact area separated from said first test contact area by a neck portion.

11. An electronic package, comprising:

a housing with four outer surfaces;

an integrated circuit within said housing; and, a lead frame coupled to said integrated circuit, said lead frame having four groups of leads each extending from a corresponding outer surface of said housing, said lead frame also having a first, a second, a third and a fourth outer die paddle support bar, said first outer die paddle support bar having a zero datum hole, said second outer die paddle support bar having a x datum slot and said fourth outer die paddle support bar having a y datum slot.

12. A method for testing an electronic package, comprising the steps of:

a) providing a package which has a plurality of leads extending from an outer surface of a housing, said leads having a first surface and an opposite second surface said package further having a first dielectric strip attached to said first surface of said leads and a Second dielectric strip attached to said second surface of said leads, said strips being located a distance from said outer surface of said housing located approximately at a final length of said leads;

b) placing a plurality of test pins into contact with said leads between said outer surface of said housing and said dielectric strip; and, c) testing said package through said test pins and said leads;

d) cutting said leads at said dielectric strip location; and, e) removing said dielectric strip.

13. The method as recited in claim 12, wherein said test pins are aligned with said leads by inserting a datum pin into a datum hole in a first outer die paddle portion of said lead frame, inserting a x alignment pin into a x alignment slot in a second outer die paddle portion of said lead frame, and inserting a y alignment pin into a y alignment slot in a fourth outer die paddle portion of said lead frame.

14. The method as recited in claim 12, further comprising the step of bending said leads.

* * * * *